United States Patent [19]

Wixley

[11] Patent Number: 4,801,866
[45] Date of Patent: Jan. 31, 1989

[54] ELECTRIC CIRCUIT TESTING EQUIPMENT

[75] Inventor: Frederick J. Wixley, Canterbury, England

[73] Assignee: GEC Avionics Limited, England

[21] Appl. No.: 774,795

[22] Filed: Sep. 11, 1985

[30] Foreign Application Priority Data

Sep. 14, 1984 [GB] United Kingdom ............... 8423310

[51] Int. Cl.$^4$ ................. G01R 31/02; G01R 19/165
[52] U.S. Cl. ............................ 324/73 PC; 324/72.5; 324/158 P; 324/158 F
[58] Field of Search .............. 324/72, 72.3, 73 PC, 324/73 R, 158 P, 158 F, 61 P, 95; 330/69; 73/304 C; 328/167; 307/520, 328, 360, 592.1

[56] References Cited

U.S. PATENT DOCUMENTS

| | | | |
|---|---|---|---|
| 2,750,562 | 6/1956 | Starr | 324/72.5 |
| 3,388,423 | 6/1968 | Biskeborn | 324/61 P |
| 3,918,306 | 11/1975 | Maltby | 73/304 C |
| 3,943,367 | 3/1976 | Baker | 324/72.5 |
| 4,012,097 | 3/1972 | Long et al. | 324/158 F |
| 4,041,373 | 8/1977 | Maringer | 324/72.5 |
| 4,054,835 | 10/1977 | Los et al. | 324/72 |
| 4,083,038 | 4/1978 | Klebanoff | 73/304 C |
| 4,085,361 | 4/1978 | Bathiomy et al. | 324/57 SS |
| 4,115,731 | 9/1978 | Axtell, III | 324/73 PC |
| 4,245,352 | 1/1981 | Karpowycz et al. | 324/73 R |
| 4,345,201 | 8/1982 | Thompson et al. | 324/73 PC |
| 4,419,626 | 12/1983 | Cedrone et al. | 324/158 F |
| 4,523,312 | 6/1985 | Takeuchi | 324/73 R |
| 4,532,442 | 7/1985 | Black | 307/520 |
| 4,574,235 | 3/1986 | Kelly et al. | 324/158 P |

FOREIGN PATENT DOCUMENTS 0166388 11/1963 U.S.S.R. ................ 324/95

OTHER PUBLICATIONS

"Coaxial Circuit Probe", by Lancaster, IBM Tech. Disc. Bull., vol. 12, #10, 3/70, p. 1644.

Primary Examiner—Reinhard J. Eisenzopf
Assistant Examiner—W. Burns
Attorney, Agent, or Firm—Kirschstein, Kirschstein, Ottinger & Israel

[57] ABSTRACT

An electric circuit testing equipment wherein signals are picked up from a selected point in the circuit by a probe unit (41) capacitively coupled to the selected point and the signals picked up by the probe unit are conditioned by circuits (47 to 61) which produce an output signal corresponding only to signals picked up by the unit from the selected point. The use of a capacitively coupled probe unit reduces the possibility of the unit affecting the operation of the circuit under test while the conditioning of the picked up signals enables the pick-up of unwanted signals to be tolerated. Designs of probe unit to minimize pick-up of unwanted signals are also described.

7 Claims, 6 Drawing Sheets

ELECTRIC CIRCUIT TESTING EQUIPMENT

BACKGROUND OF THE INVENTION

1. Field of the Invention

This invention relates to electric circuit testing equipment.

The invention relates especially, although not exclusively, to such equipment for use in automatic testing of integrated circuits.

2. Description of Related Art

In order to test electrical circuits it is necessary to apply probes to selected points in the circuit to pick up the signals at those points.

With modern, high speed, digital circuits, if testing is to be effective it is desirable that the circuit be tested whilst functioning but it is necessary that the probes do not significantly disturb the functional performance of the circuit.

SUMMARY OF THE INVENTION

It is an object of the present invention to provide an electric circuit testing equipment wherein this difficulty is overcome.

According to the present invention there is provided an electric circuit testing equipment comprising at least one signal pick-up probe unit adapted to be capacitively coupled with a selected point of a circuit to be tested; signal conditioning circuit means responsive to the signals picked up by the probe unit to produce an output signal corresponding only to signals picked up by the probe unit from said selected point; and means utilising said output signal for test purposes.

In an equipment according to the invention said circuit means suitably comprises means for producing an output signal corresponding only to signals picked up by the probe unit from said selected point whose amplitudes exceed a predetermined threshold value.

Preferably said circuit means comprises: first means for differentiating the signals picked up by the probe unit; comparator means for producing an output in response to each excursion in an input signal derived from the differentiated signals beyond a first threshold value of a first polarity or beyond a second threshold value of the opposite polarity to but substantially the same magnitude as the first threshold value; and flip-flop means responsive to the output of the comparator means.

In one particular embodiment, said probe unit comprises a first probe adapted to be positioned adjacent said selected point and at least one further probe adapted to be positioned with the first probe positioned as aforesaid adjacent a point of the circuit to be tested adjacent said selected point, and said circuit means includes means connected between said differentiating means and said comparator means for subtracting a proportion of the differentiated signals of said further probe from the differentiated signals of said first probe.

The invention resides in the realisation that disturbance of the functional performance of the circuit being tested can be minimised by using a probe unit capacitively coupled to the selected point in the circuit, and that the consequential pick-up of unwanted signals that can then occur can be tolerated if a circuit means is provided to suitably condition the output signal of the probe unit.

It will be understood that whilst the signal conditioning circuit means of an equipment according to the invention allows a degree of pick-up of unwanted signals to be tolerated, a capacitively coupled probe unit for use in an equipment according to the invention is nevertheless preferably designed to minimise pick-up of unwanted signals.

Hence, in one particular embodiment wherein said probe unit is adapted to pick up the signal appearing at a selected point along an electrical conductor carried on a planar substrate, e.g. a printed circuit card, said probe unit comprises: a tubular member of electrically conducting material; a pair of elongated members of electrically conducting material secured to one end of said tubular member so as to extend perpendicular to the axis of the tubular member in parallel spaced relationship such that the axis of the tubular member intersects the axis of the gap between said elongated members substantially at right angles; and an insulated conductor extending through said tubular member and along the gap between said elongated members.

Preferably there are two such insulated conductors which respectively extend along said gap in opposite directions with respect to the axis of the tubular member.

In another particular embodiment of the invention said probe unit forms part of a multi-test probe unit adapted to pick up simultaneously by the signals appearing on the leads of an integrated circuit package, said multi-test probe unit comprising: a body portion of electrically insulating material including a wall portion disposed on a side of a cavity adapted to receive the package with a line of leads of the package facing said wall portion; a plurality of bores within said wall portion disposed in parallel spaced relationship corresponding to the spaced relationship of the leads of the adjacent line of leads of the package; and extending along each bore a coaxial conductor pair the outer conductor of which is removed at the extremity of the pair adjacent said cavity over a region adjacent and substantially centered on the corresponding lead of the package.

In one such particular embodiment wherein said integrated circuit package is a dual-in-line package said body portion has two parallel planar spaced said wall portions, said cavity being adapted to receive said package with each line of leads of the package facing a respective one of said two wall portions.

BRIEF DESCRIPTION OF THE DRAWINGS

One electric circuit testing equipment in accordance with the invention will now be described, by way of example, with reference to the accompanying drawings in which.

DETAILED DESCRIPTION OF THE PREFERRED EMBODIMENTS

The equipment is intended for use in the automatic testing of printed circuit boards carrying high speed binary signal circuits of dual-in-line package integrated circuit form.

Figure 1:
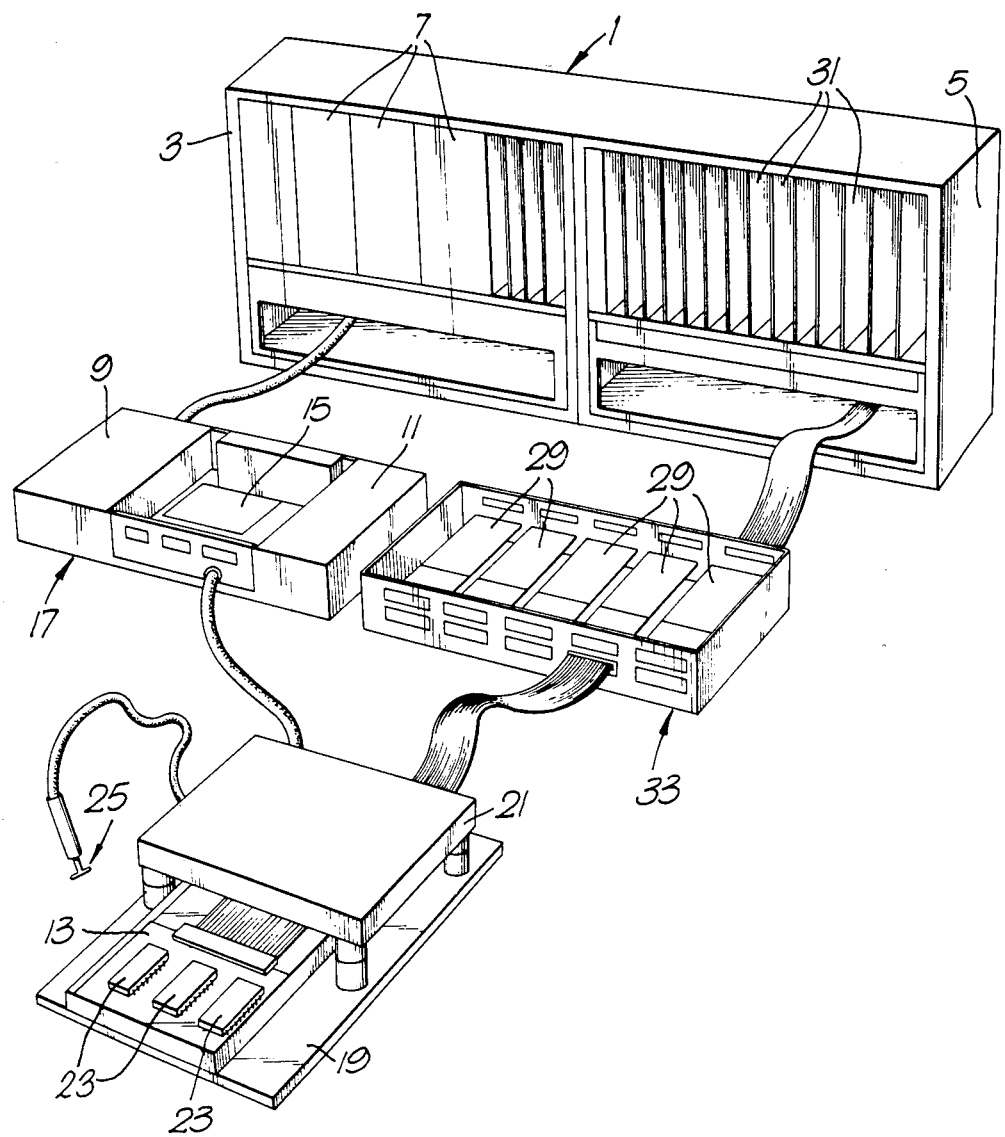
FIG. 1 is a general perspective view of the whole equipment.

Referring to FIG. 1, the equipment is intended for use on a table top and is for the most part contained in a housing 1.

The housing has two compartments 3 and 5, one housing the power supply units of the equipment and the other housing signal handling circuits of the equipment.

Power supplies for the internal circuits of the equipment are carried on circuit boards 7 housed in an upper part of the compartment 3 and a power supply 9 and associated switching 11 for an electric circuit board 13 to be tested, together with other components 15 required to be connected to the board for testing purposes, such as loads, are mounted in removable drawer 17 housed normally in the lower part of the compartment 3, but shown withdrawn in FIG. 1.

The circuit board 13 to be tested is placed in a test jig 19 during testing. Above one half of the circuit board jig 19 there is a jig 21 which carries a number of multi test probe units (not visible in FIG. 1, but described below). The probes of the probe units are adapted to be coupled with the pins of integrated circuit packages 23 carried on the circuit board 13 when the circuit board 13 is slid under the probe unit jig 21 and the probe unit jig 21 lowered into position over the board 13.

In FIG. 1, the circuit board 13 is shown withdrawn from under the probe unit jig 21 to allow manual application of a single test probe unit 25 (further described below) to a selected point on the circuit board 13.

The signals picked up by the probe units are fed by way of signal conditioning circuits comprising differentiating and amplifying circuits contained in the probe unit jig 21 and comparator units 29 to signal handling circuits carried on circuit boards 31 housed in an upper part of the compartment 5 of the housing 1, the comparator units 29 being mounted in a removable drawer 33 housed normally in the lower part of the compartment 5, but shown withdrawn in FIG. 1.

The signal handling circuits carried on the boards 31 essentially comprise logic circuits for carrying out appropriate tests of the conditioned probe signals supplied via the comparator units 29. The results of these tests are passed to a computer (not shown) for analysis and display.

Each of the test probes is constructed so as to be capacitively coupled to an integrated circuit package pin or the selected point on the printed circuit board under test so as to load only very lightly the circuit under test. As a consequence of such capacitive coupling there is a high possibility that a probe will pick up an unwanted signal from an adjacent integrated circuit package pin or circuit board conductor. The purpose of the signal conditioning circuits is to suppress such unwanted signals.

Figure 2:
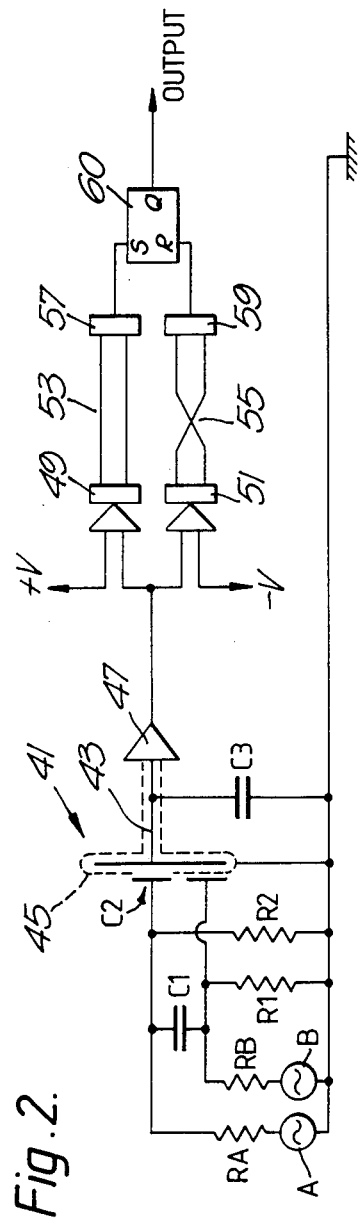
FIG. 2 is a block schematic circuit diagram of a part of the equipment.

Referring now to FIG. 2, each probe 41 esssentially comprises an inner conductor 43 coaxially surrounded, but insulated form, a metal shield 45. The shield 45 completely encloses the inner conductor 43 except over a small end portion of the inner conductor, which portion is placed adjacent but spaced from the pin or circuit point to be tested in use so as to be capacitively coupled thereto, as represented by capacitor C2 in FIG. 2. Each probe is associated with a signal conditioning circuit including an amplifier 47 to whose input a wanted signal is fed via the probe capacitance C2, the wanted signal being represented in FIG. 2 by a generator A of internal resistance RA. An unwanted signal fed to the input of the amplifier 47 via the probe capacitance C2 is indicated by a generator B of internal resistance RB. Capacitor C1 represents unavoidable circuit coupling between the pin or circuit point under test and an adjacent pin or circuit point which results in the unwanted signal being fed to the amplifier 47 via the probe 41. It will be noted that the probe shield 45 prevents the amplitude of the unwanted signal picked up by the probe 41 from appreciably exceeding that due to capacitor C1 so that the unwanted signal is of significantly smaller amplitude than the wanted signal.

Capacitor C3 represents the capacitance between the inner conductor 43 and the shield 45 of the probe 41, and the resistors R1 and R2 the leakage resistances between the pins or circuit points and ground.

Figure 3:
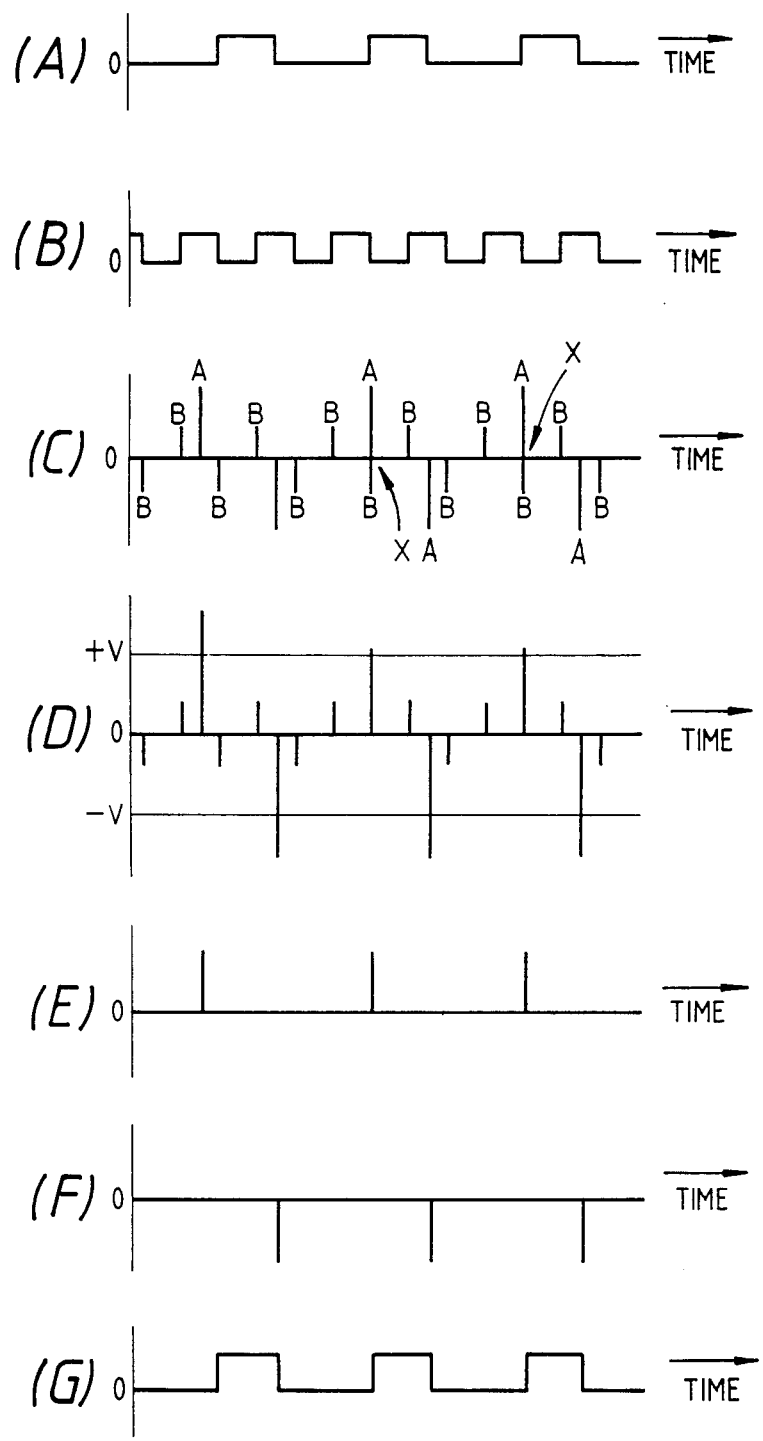
FIG. 3 illustrates the waveforms of signals appearing at various points of the circuit of FIG. 2.

In operation, a wanted binary signal A (FIG. 3A), and an unwanted binary signal B (FIG. 3B) applied to the probe will be differentiated by the capacitance C2 of the probe and the leakage resistance R2, and a proportion of the differentiated signals (FIG. 3C) determined by the relative values of capacitances C2 and C3 applied to the input of amplifier 47. The output of amplifier 47 is applied to one input of each of two comparators 49 and 51. Threshold voltages $+V$ and $-V$ are of equal magnitude and opposite polarity are respectively applied to the other inputs of comparators 49 and 51 (see FIG. 3D), their magnitude lying below the difference between the values of a differentiated A signal and a differentiated B signal at the output of the amplifier, and above the value of a differentiated B signal.

Thus there appears at the outputs of comparators 49 and 51 respectively signals corresponding to the positive-going and negative-going differentiated A signals at the output of the amplifier 47 (see FIGS. 3E and 3F).

It will be understood in this connection that for satisfactory operation the amplitude of the B signals must not appreciably exceed about 40% of the amplitude of the A signals so that if differentiated A and B signals of opposite polarity coincide, as indicated at X in FIG. 3C, the resultant signal (FIG. 3D) is still significantly greater in amplitude than a B signal.

The outputs of comparators 49 and 51 are respectively applied via transmission lines 53 and 55 and drivers 57 and 59 to the 'set' and 'reset' inputs of a flip-flop 60, the required inversion of the output of comparator 51 being indicated by a cross-over in the conductor of transmission line 55.

In response to its inputs the flip-flop 60 thus produces at its output a pulse signal (see FIG. 3G) corresponding to the signal A picked up by the probe with the unwanted B signal totally suppressed.

Figure 4:
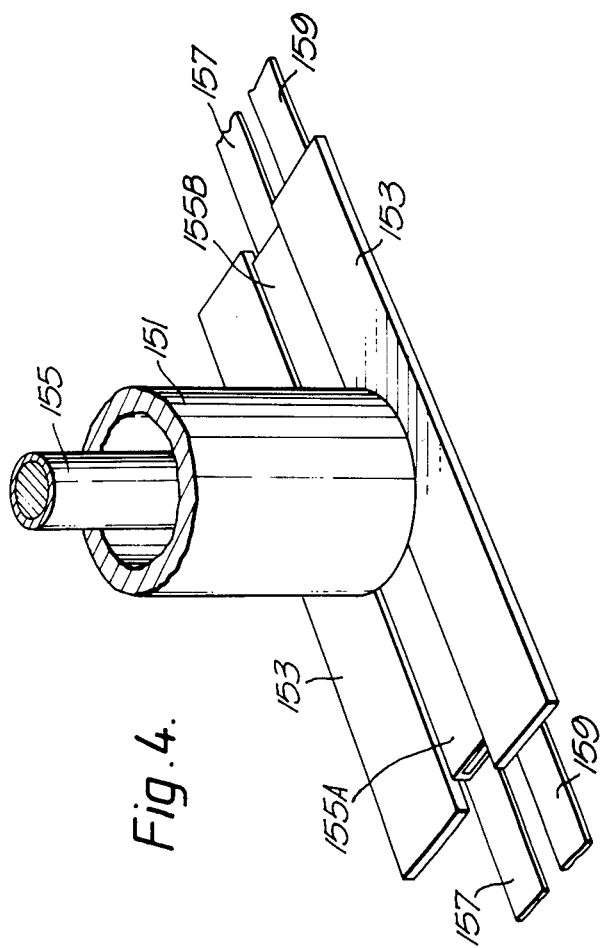
FIG. 4 is a diagrammatic perspective view illustrating one test probe included in the equipment.

Referring now to FIG. 4, the probe unit 25 suitably comprises a metal tubular body portion 151 to one end of which are secured two metal strips 153, the strips extending at right angles to the axis of the body portion in parallel spaced relationship so that the axis of the gap between the strips intersects the axis of the body portion. An insulated conductor 155 extends through the body portion 151 which at the end of the body portion to which the strips are attached divides into two parts 155A, 155B the two parts lying in the gap between the strips, one on either side of the body portion 151. The ends of the conductor 155 and body portion 151 remote from the strips 153 are respectively connected to the circuits in the probe unit jig 21 via the inner and outer of a coaxial cable (not shown).

In use the end parts 155A and 155B of the inner conductor of the probe must be placed so as to be along the printed circuit board conductor 157 whose signal is to be monitored, the strips 153 then serving to shield the end parts 155A, 155B, from a circuit conductor 159 to either side of the conductor 157.

Figure 5:
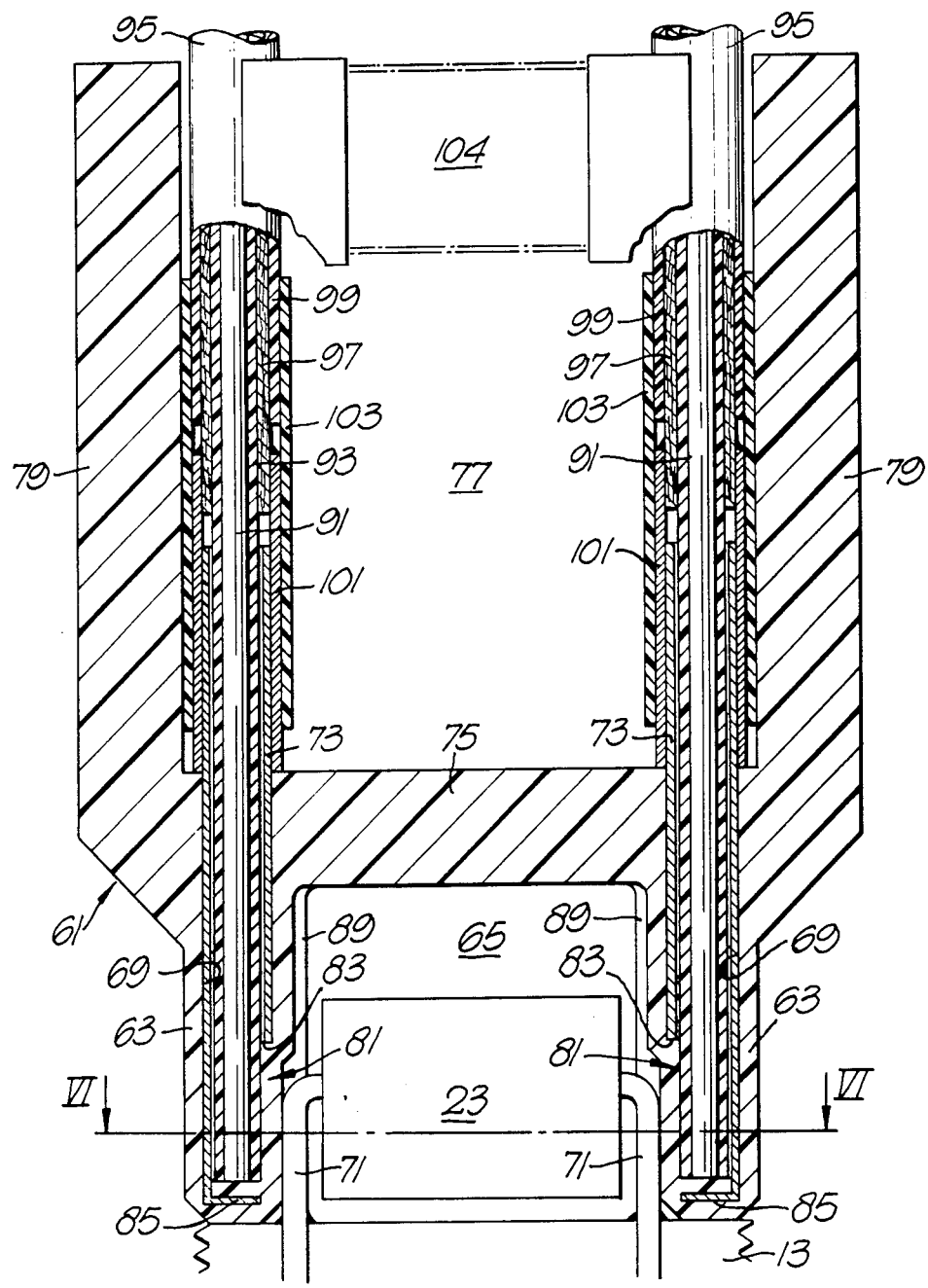
FIG. 5 is a sectional view of a multi-test probe unit included in the equipment.
Figure 6:
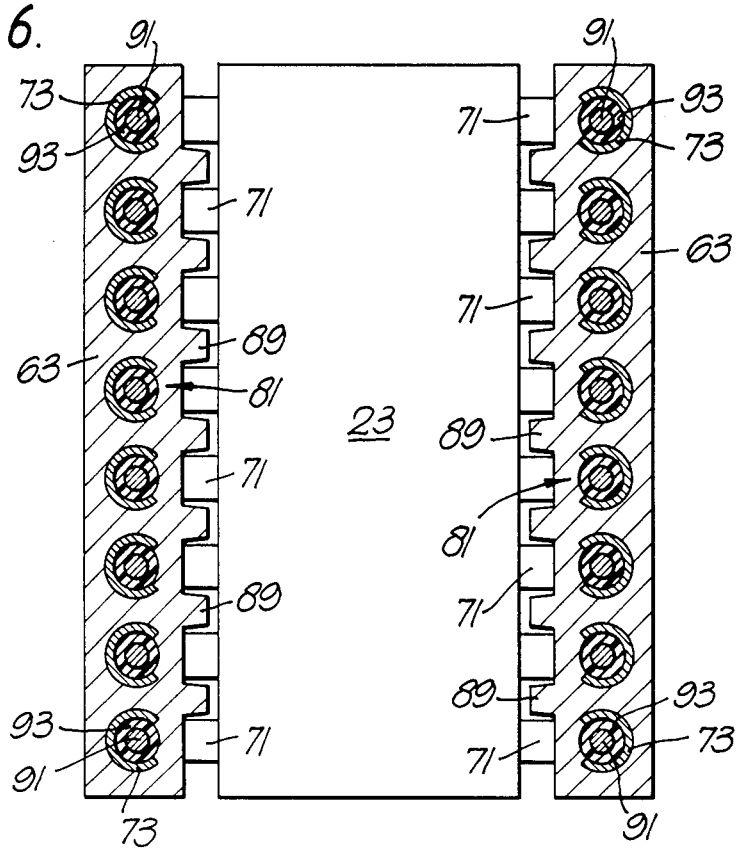
FIG. 6 is a sectional view along the line VI—VI in FIG. 5.

Referring now to FIGS. 5 and 6, the multi-test probe units attached to the probe unit jig 21 suitably comprise a moulded body portion 61 of plastics material of generally H-shaped cross-section.

The lower parts 63 of the vertical limbs of the body portion constitute parallel planar spaced wall portions of the body 61 which are disposed on either side of a cavity 65 which receives a dual-in-line integrated circuit package 23 in use of the unit. A number of bores 69 extend vertically through each wall portion 63, the bores being disposed in parallel spaced relationship in like manner to the connector pins 71 of the package 23.

Each bore 69 houses a metal tube 73 which at its upper end extends beyond the horizontal limb 75 of the body 61 into a cavity 77 bounded by the upper parts 79 of the vertical limbs of the body 61, and at its lower end has an arcuate portion cut away to provide an aperture 81 at its side adjacent the cavity 65, the end of the tube 73 adjacent the arcuate cut-out locating on a shoulder 83 jutting into the bore 69. Apart from the aperture 81 formed by the cut-away portion, each tube 73 is closed at its lower end, the end closure 85 being embedded in the plastics material of the body portion 61 during moulding.

In use the unit is lowered onto a package 23 until the free ends of the wall portions 63 contact the circuit board 13 carrying the package 23.

The inner surfaces of the wall portions 63 are recessed to receive the pins 71 of the package 23 and provide lips 89 which fit between the pins 71 and so align the apertures 81 in the tubes 73 with the pins 71.

Along the inside of each tube 73 there extends the inner conductor 91 and surrounding insulation 93 of a coaxial screened cable 95, the screen 97 of the cable having been stripped back to lie just above the upper end of the tube 73, and the outer insulating sheath 99 of the cable being stripped back slightly further. The adjacent ends of the cable screen 97, and tube 73 are soldered within a metal sleeve 101 which in turn fits within a further sleeve 103 of insulating material which extends upwardly beyond the end of the metal sleeve 101 to cover the solder joint between the sleeve 101 and the cable screen 99.

At their upper ends the screened cables 95 pass out of the body portion 61 of the unit and thence to the signal conditioning circuits 27 housed in the probe unit jig 21, the cables being clamped to the body portion by suitably shaped spring loaded clamp means 104 inserted into the upper part of the cavity 77.

As best illustrated in FIG. 6, the aperture 81 in the metal tubes 73 allow the each inner conductor 91 of each screened cable 95 to be capacitively coupled to the nearest integrated circuit package pin 71, the tubes 73 serving to shield the inner conductors 91 from the pins 71 on either side of the nearest pin. Similarly the end closure 85 of each tube 73 shields the bottom end of the associated inner conductor 91.

Figure 7:
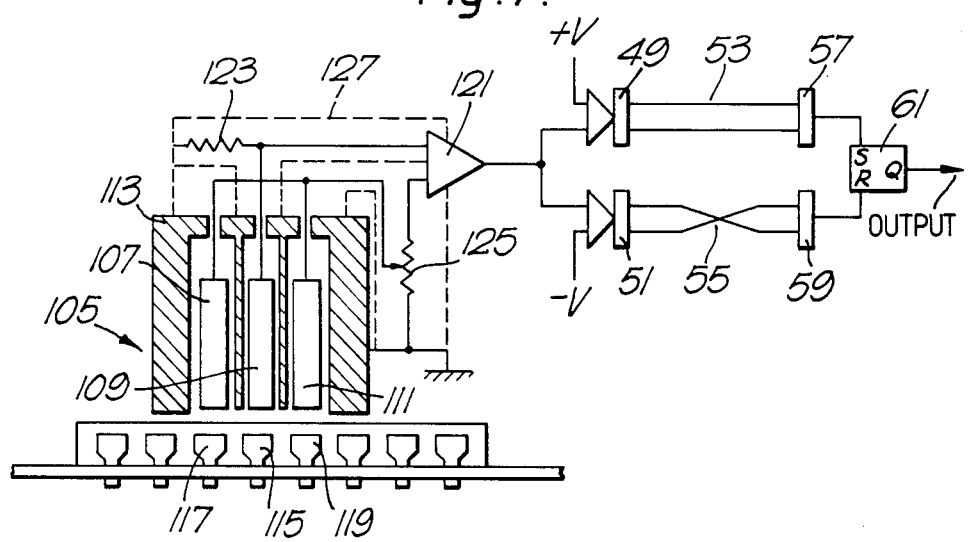
FIG. 7 is a block schematic diagram of an alternative form of the part of the equipment shown in FIG. 2.

FIG. 7 illustrates an alternative form of signal conditioning circuit to that illustrated in FIG. 2 which is especially suitable for use in an equipment according to the invention with a probe unit adapted to monitor the signal on a selected one of a line of test points from a position spaced from the selected test point by a sufficiently large amount to render it difficult to avoid excessive pick-up from adjacent test points by the use of screening. Such a situation may arise for example when testing signals on a so-called conformally coated printed circuit card, i.e. a printed circuit board of which the conductors and components are protected by an insulating coating, or when using the probe unit to scan along a line of test points to find a particular signal.

Referring to FIG. 7, the probe unit 105 comprises three probes formed by three conductors 107, 109 and 111 arranged in a line in parallel spaced relationship and each coaxially surrounded by, but insulated from a grounded metal shield 113. The shield completely encloses each conductor except over a small end portion. In use the exposed end portion of the central conductor 109 is placed adjacent but spaced from a circuit lead 115 carrying thereto. The conductors 107 to 111 are spaced so that the exposed end portions of the other two conductors 107 and 111 will then be adjacent circuit leads 117 and 119 on either side of the lead 115, the leads carrying signals B and C respectively.

The signal conditioning circuit comprises a differential amplifier 121 having one input directly connected to the conductor 109 and via a resistor 123 to ground. The other input of the amplifier 121 is connected to ground via a potentiometer 125 whose variable capping point is connected to each of the conductors 107 and 111. The leads between the amplifier 121 and the probe unit 105 are individually screened as indicated by dotted line 127.

The output of the amplifier 121 is applied to a comparator and flip-flop arrangement 49 to 61 of the same form as shown in FIG. 2.

Figure 8:
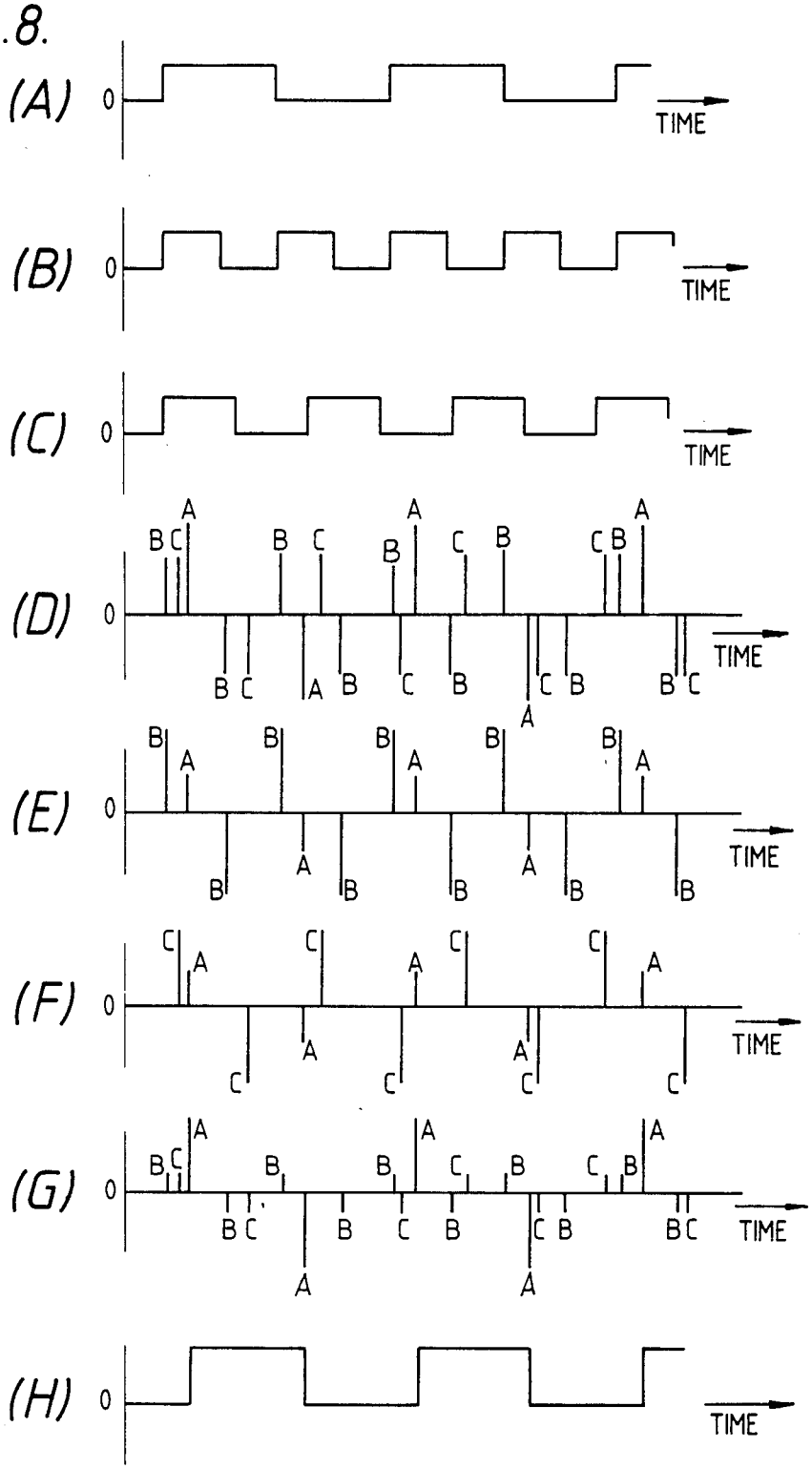
FIG. 8 illustrates the waveforms of signals appearing at various points of the circuit of FIG. 7.

In operation binary signals A, B and C appearing on circuit leads 115, 117 and 199 (FIGS. 8A, 8B and 8C) will all be picked up by the central conductor 109 and differentiated as described above with reference to FIG. 2 giving rise to a signal at one input of the amplifier 121 as shown in FIG. 8D, the differentiated A signals from lead 115 being larger than those from the other two leads 117 and 119.

The other two conductors 107 and 111 respectively give rise to differentiated A and B signals from leads 115 and 117 and to differentiated A and C signals from leads 115 and 119 at the other input of the amplifier 121, as shown in FIGS. 8E and 8F respectively. In the amplifier 121 the differentiated B and C signals tend to cancel giving rise to a signal at the output of amplifier 121 as shown in FIG. 8G wherein the differentiated A signals are appreciably larger compared with the B and C signals than in the signal at the input of the amplifier 121 connected to conductor 109.

The comparator and flip-flop arrangement 49 to 61 then produces at its output a pulse signal (FIG. 8H) corresponding to signal A with the unwanted signals B and C totally suppressed, as described above with reference to FIGS. 2 and 3.

It will be appreciated that the potentiometer 125 is used to balance the B and C signals picked up by conductor 109 against the B and C signals picked up by conductors 107 and 111.

It will be understood that a signal conditioning circuit as shown in FIG. 7 is especially adapted for use with a multi-test probe unit as shown in FIGS. 5 and 6, the conditioning circuit being arranged to utilise as inputs the signal produced by any selected adjacent three probes of the unit by means of a suitable selector circuit arrangement.

It will further be understood that a signal conditioning circuit of the form shown in FIG. 7 may also be modified so as to utilise the signals produced by two or more than three adjacent probes, where the disposition of test points in a circuit to be tested require this.

It is pointed out that whilst in the embodiments of the invention described above by way of example the probes of the probe units do not physically contact the circuit to be tested, this is not necessarily the case. Thus in other embodiments of the invention the probes may have built-in capacitors one electrode of which is provided with an extension adapted to physically contact the circuit to be tested.

I claim:

1. An electric circuit testing equipment comprising: at least one electrical signal pick-up probe unit dimensioned and configured for placement so as to be capacitively coupled with a selected point of a circuit to be tested, said probe unit including a tubular member of electrically conducting material; a pair of elongated members of electrically conducting material secured to one end of said tubular member so as to extend perpendicular to an axis of the tubular member in parallel spaced relationship such that the axis of the tubular member intersects an axis of a gap between said elongated members substantially at right angles; an insulated conductor extending through said tubular member and along the gap between said elongated members; signal conditioning circuit means responsive to signals picked up by the probe unit to suppress signals picked up by the probe unit from any point of the circuit adjacent said selected point, thereby to produce an output signal corresponding only to signals picked up by the probe unit from said selected point; and means utilizing said output signal for test purposes.

2. An electric circuit testing equipment, comprising: at least one electrical signal pick-up probe unit dimensioned and configured for placement so as to be capacitively coupled with a selected point of a circuit to be tested; signal conditioning circuit means responsive to signals picked up by the probe unit to suppress signals picked up by the probe unit from any point of the circuit adjacent said selected point, thereby to produce an output signal corresponding only to signals picked up by the probe unit from said selected point, said circuit means comprising means for producing an output signal corresponding only to signals picked up by the probe unit from said selected point whose amplitudes exceed a predetermined threshold value, said circuit means further comprising means for differentiating the signals picked up by the probe unit, comparator means for producing an output in response to each excursion in input signals derived from said means for differentiating beyond a first threshold value of a first polarity or beyond a second threshold value of opposite polarity to but substantially equal magnitude to the first threshold value, and flip-flop means responsive to the output of the comparator means; and means utilizing said output signal for test purposes.

3. An electric circuit testing equipment comprising: at least one electrical signal pick-up probe unit dimensioned and configured for placement so as to be capacitively coupled with a selected point of a circuit to be tested, said probe unit forming part of a multi-test probe unit operative for picking up simultaneously signals appearing on leads of an integrated circuit package disposed in a line in a spaced relationship, said multi-test probe unit comprising a body portion of electrically insulating material including a wall portion disposed on a side of a cavity for receiving the package with said line of leads facing said wall portion, a plurality of bores within said wall portion disposed in a parallel spaced relationship corresponding to the spaced relationship of said line of leads of the package, and a coaxial conductor pair extending along each bore and having an outer conductor which is removed at an extremity of the pair adjacent said cavity over a region adjacent and substantially centered on the corresponding lead of the package; signal conditioning circuit means responsive to signals picked up by the probe unit to suppress signals picked up by the probe unit from any point of the circuit adjacent said selected point, thereby to produce an output signal corresponding only to signals picked up by the probe unit from said selected point; and means utilizing said output signal for test purposes.

4. An equipment according to claim 2 wherein said probe unit comprises a first probe for positioning adjacent said selected point and at least one further probe for positioning, with the first probe positioned as aforesaid, adjacent a point of the circuit to be tested adjacent said selected point, and said circuit means includes means connected between said differentiating means and said comparator means for subtracting a proportion of a differentiated signal of said further probe derived from said means for differentiating from a differentiated signal of said first probe.

5. An equipment according to claim 4 wherein said means for subtracting comprises a differential amplifier.

6. An equipment according to claim 1 wherein there are two such insulated conductors which respectively extend along said gap in opposite directions with respect to the axis of the tubular member.

7. An equipment according to claim 3 wherein said integrated circuit package is a dual-in-line package and said body portion has two parallel planar spaced wall portions, said cavity being adapted to receive said package with each line of leads of the package facing a respective one of said two wall portions.

* * * * *